(12) United States Patent
Huang et al.

(10) Patent No.: US 11,509,278 B2
(45) Date of Patent: Nov. 22, 2022

(54) COMMON-MODE NOISE FILTER

(71) Applicant: EMPASS TECHNOLOGY INC., Taipei (TW)

(72) Inventors: Yang-Chih Huang, Taipei (TW); Ying-Cheng Tseng, Taipei (TW); Chin-Yi Lin, Taipei (TW)

(73) Assignee: Empass Technology Inc., Taipei (TW)

( * ) Notice: Subject to any disclaimer, the term of this patent is extended or adjusted under 35 U.S.C. 154(b) by 0 days.

(21) Appl. No.: 17/352,946

(22) Filed: Jun. 21, 2021

(65) Prior Publication Data

US 2022/0123706 A1   Apr. 21, 2022

(51) Int. Cl.
*H03H 7/42*   (2006.01)
*H03H 7/01*   (2006.01)

(52) U.S. Cl.
CPC .......... *H03H 7/427* (2013.01); *H03H 7/0115* (2013.01); *H03H 7/0138* (2013.01)

(58) Field of Classification Search
CPC ........ H03H 7/427; H03H 7/0115; H03H 7/09; H03H 1/0007
USPC ........................................ 333/177, 181, 185
See application file for complete search history.

(56) References Cited

U.S. PATENT DOCUMENTS

| 6,097,262 | A  | * | 8/2000 | Combellack | ........ H04L 25/0274 |
|           |    |   |        |            | 333/32 |
| 6,788,558 | B2 |   | 9/2004 | Pelly      |  |
| 2016/0093937 | A1 | * | 3/2016 | Chiou   | ...................... H05K 1/00 |
|           |    |   |        |            | 333/185 |
| 2017/0194931 | A1 | * | 7/2017 | Xu      | ........................ H03H 7/0138 |

FOREIGN PATENT DOCUMENTS

| CN | 102474235 A | 5/2012 |
| CN | 107623435 A | 1/2018 |
| TW | I407461 B | 9/2013 |
| WO | 2012072367 A2 | 7/2012 |

* cited by examiner

*Primary Examiner* — Rakesh B Patel
(74) *Attorney, Agent, or Firm* — Rosenberg, Klein & Lee

(57) ABSTRACT

A common-mode noise filter is provided, and comprises a first transmission structure and a second transmission structure. At least one first transmission unit is connected between a first signal input end and a first signal output end of the first transmission structure in series. At least one second transmission unit is connected between a second signal input end and a second signal output end of the second transmission structure in series. Two first capacitors are connected between the first signal input end and the second signal input end in series, and connected at a first node together. A first common-mode noise suppression unit is connected between the first node and a reference potential, and comprises a second capacitor and a first lossy element connected to the second capacitor in series or parallel. The first common-mode noise suppression unit can absorb a common-mode noise via the first lossy element.

18 Claims, 16 Drawing Sheets

COMMON-MODE NOISE FILTER

This non-provisional application claims priority claim under 35 U.S.C. § 119(a) on Taiwan Patent Application No. 109136035 filed Oct. 16, 2020, the entire contents of which are incorporated herein by reference.

FIELD OF THE INVENTION

The present invention is related to a filter, particularly to a filter for suppressing a common-mode noise.

BACKGROUND

The advance of technology has driven faster operation speed and clock frequency for digital circuits such that the techniques of differential signaling are conventionally applied in high-speed data transmission applications. The differential transmission lines have the characteristics of low electromagnetic radiation and low crosstalk, and therefore play an important role in digital signal transmission. However, non-ideal circuit structures, such as asymmetrical wiring, bended signal trajectory, and the existence of slots are inevitable in practical. Those non-ideal circuit structures may adversely convert the differential-mode signals into common-mode noises, which may induce unintended radiation, and cause serious electromagnetic interference (EMI) or radio frequency interference (RFI) problems.

One of the most common solutions to those unwanted radiation is to use ferromagnetic components, for example, common-mode choke (CMC). However, the permeability of the electromagnetic material attenuates quickly in high frequency, which means that the effectiveness of the CMC may degrade at Gigahertz frequency. Thus, common-mode reflection circuits with defective ground structures or mushroom structures are proposed successively. The defective ground structure or the mushroom structure constructs a resonant cavity in the symmetry plane of two differential signal paths to suppress the common-mode noise. These structures can achieve good common-mode noise suppression at gigahertz or even higher frequency through proper design.

The aforementioned common-mode reflection circuit can reflect the common-mode noise back to the noise source in order to isolate the noise source from the electromagnetic noise radiator. While the noise radiator is not excited, the unintended radiation can be dramatically reduced. However, in practical environment, the noise radiators may locate all around the electric devices, including but not limited to PCB routings, mechanical connectors and metal heat sinks. It is hard to prevent the reflected common-node noise from all the noise radiators. Once the reflected common-mode noise is coupled to the noise radiators, the EMI and RFI may worsen. That is to say, in certain cases, the existence of the common-mode chokes or common-mode reflection circuits may cause opposite effect on EMI and RFI solutions.

In view of the above, the present invention is provided with a novel common-mode noise filter. The filter is able to suppress the common-mode noise in broad frequency band by means of absorption, instead of reflection. The electromagnetic noise will be converted into heat through the proposed filter, and therefore can prevent the opposite effect in certain situations.

US 2012/0075036 discloses a common-mode filter. In FIG. 2 of that disclosed invention, several resistors are included in a series resonance circuit of the common-mode filter to reduce the quality factor of the resonator in order to broaden the suppression band and offer partially absorption of common-mode noise. One of the obviously disadvantages of the disclosed invention is that if high absorption rate is required, the resonance circuit needs multiple stages since each stage can only offer partially absorption of common-mode noise, at the cost of size, circuit complexity and differential signal quality. Besides, in real applications, the common-mode filter should achieve broadband suppression in order to solve complicated RFI and EMI problems. In this invention, achieving broadband/multiple band absorption and high absorption rate are two main goals. Conventionally, the absorption rate (AR) of the port 1 is defined as: AR= $(1-|S_{cc11}|^2-|S_{cc21}|^2-|S_{dc11}|^2-|S_{dc21}|^2$ radiated power)× 100%. $|S_{cc11}|$ is common-mode reflection coefficient, $|S_{cc21}|$ is common-mode transmission coefficient, $|S_{dc11}|$ and $|S_{dc21}|$ are mode-conversion coefficients.

SUMMARY

It is one objective of the present invention to provide a common-mode noise filter, in which the common-mode noise filter comprises a first transmission structure, a second transmission structure, and a first common-mode noise suppression circuit. At least one first transmission unit is connected between a first signal input end and a first signal output end of the first transmission structure in series. At least one second transmission unit is connected between a second signal input end and a second signal output end of the second transmission structure in series. Two first capacitors are connected between the first signal input end and the second signal input end in series, and connected at a first node together. The first common-mode noise suppression circuit is connected between the first node and a reference potential, and comprises a capacitive element and a lossy element. The capacitive element is connected to the first lossy element in series or parallel. Accordingly, the common-mode noise filter can generate resonances at multiple frequency bands, so as to effectively suppress and absorb the common-mode noise in a broader frequency band.

It is another objective of the present invention to provide a common-mode noise filter, in which the common-mode noise filter further comprises a second common-mode noise suppression circuit. Two second capacitors are connected between the first signal output end and the second signal output end in series, and connected at a second node together. The second common-mode noise suppression circuit is connected between the second node and the reference potential, and comprises an inductive element. The second common-mode noise suppression circuit can reflect the common-mode noise by the inductive element, such that the common-mode noise can be prevented from transmitting to the noise radiator connected to the common-mode noise filter, and further avoid the interference to the function of the electric device or surroundings. The second common-mode noise suppression circuit enhances the suppression ability of the total filter, and forces all the common-mode noise to be reflected back (if not be absorbed when passing the first common-mode noise suppression circuit at the first time) and passed through the first common-mode noise suppression circuit again to strengthen the absorptive ability of the total common-mode noise filter. To be more specific, if the common-mode input admittance of the second common-mode noise suppression circuit and the loading is $Y_{2,common}$, the input common-mode admittance of the first common-mode noise suppression circuit is $Y_{1,common}$, and the common-mode port admittance is $Y_{port,common}$, to achieve high absorption rate, the relation is $Y^*_{port,common} \approx Y_{1,common} + Y_{2,common}$.

For achieving the above objectives, the present invention provides a common-mode noise filter, comprising: a first transmission structure comprising a first signal input end and a first signal output end, in which at least one first transmission unit is connected between the first signal input end and the first signal output end in series; a second transmission structure comprising a second signal input end and a second signal output end, in which at least one second transmission unit is connected between the second signal input end and the second signal output end in series, the first transmission structure and the second transmission structure are combined into a pair of differential transmission structures for transmitting a differential signal; two first capacitors connected between the first signal input end and the second signal input end in series or connected between one end of the at least one first transmission unit and one end of the at least one second transmission unit in series, wherein the two first capacitors are connected at a first node together; and a first common-mode noise suppression circuit, connected between the first node and a reference potential, and comprising a second capacitor and a first lossy element, wherein the second capacitor is connected to the first lossy element in series or parallel, and the first common-mode noise suppression circuit absorbs a common-mode noise via the first lossy element.

In one embodiment of the present invention, wherein the at least one first transmission unit is a first inductor, the at least one second transmission unit is a second inductor, a mutual inductor is formed between the at least one first transmission unit and the at least one second transmission unit.

In one embodiment of the present invention, wherein the at least one first transmission unit is connected to a third capacitor in parallel, and the at least one second transmission unit is connected to a fourth capacitor in parallel.

In one embodiment of the present invention, wherein the common-mode noise filter further comprises a fifth capacitor and a sixth capacitor, two ends of the at least one first transmission unit are connected to one end of the fifth capacitor and one end of the sixth capacitor, respectively, and two ends of the at least one second transmission unit are connected to other end of the sixth capacitor and other end of the fifth capacitor, respectively.

In one embodiment of the present invention, wherein the common-mode noise filter further comprises a third inductor, the third inductor is provided at one end thereof connected to the first node, and other end thereof connected to the reference potential via the first lossy element and the second capacitor connected therewith in parallel.

In one embodiment of the present invention, wherein the common-mode noise filter further comprises a third inductor, the first lossy element is provided at one end thereof connected to the first node via the third inductor and the second capacitor connected therewith in parallel, and other end thereof connected to the reference potential.

In one embodiment of the present invention, wherein the first common-mode noise suppression circuit further comprises a third inductor connected to the first lossy element in series, the second capacitor is provided between the first node and the reference potential, and parallel with the first lossy element and the third inductor connected therewith in series.

In one embodiment of the present invention, wherein the first common-mode noise suppression circuit further comprises a third inductor, the second capacitor is connected to the first lossy element in series, the third inductor is provided between the first node and the reference potential, and parallel with the first lossy element and the second capacitor connected therewith in series.

In one embodiment of the present invention, wherein the common-mode noise filter further comprises two seventh capacitors and a second common-mode noise suppression circuit; the two seventh capacitors are connected between the first signal output end and the second signal output end in series or connected between other end of the at least one first transmission unit and other end of the at least one second transmission unit in series; the two seventh capacitors are connected at a second node together; the second common-mode noise suppression circuit is connected between the second node and the reference potential, comprises a fourth inductor, and reflects the common-mode noise via the fourth inductor.

In one embodiment of the present invention, wherein the second common-mode noise suppression circuit further comprises an eighth capacitor connected to the fourth inductor in series or parallel.

In one embodiment of the present invention, wherein the second common-mode noise suppression circuit further comprises a second lossy element connected to the eighth capacitor and the fourth inductor in series or parallel.

In one embodiment of the present invention, wherein a fifth inductor is provided at one end thereof connected to the first node, and other end thereof connected to the third inductor and the second capacitor connected therewith in parallel.

In one embodiment of the present invention, wherein the at least one first transmission unit or the at least one second transmission unit is a strongly-coupled transmission line, a high-impedance transmission line, or an inductor.

DETAILED DESCRIPTION OF THE PREFERRED EMBODIMENTS

Figure 1:
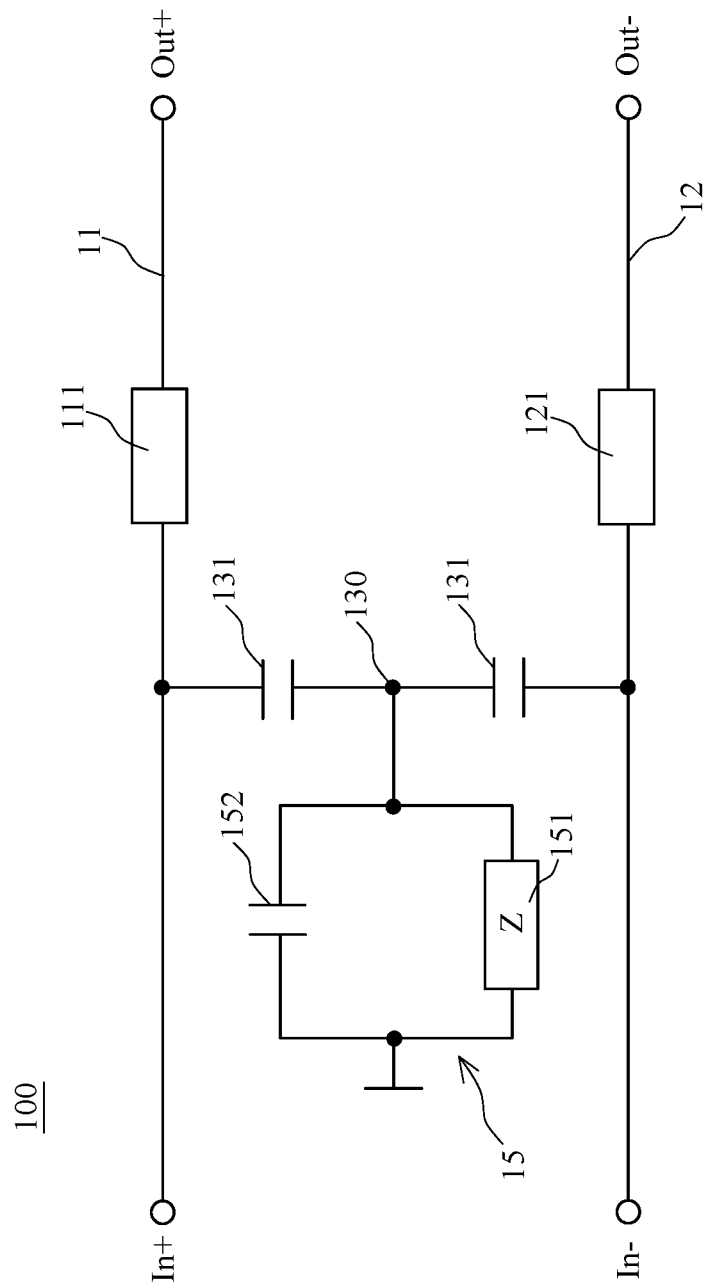
FIG. 1 is a circuit diagram of a common-mode noise filter according to one embodiment of the present invention.

Referring to FIG. 1, there shows a circuit diagram of a common-mode noise filter according to one embodiment of the present invention. As shown in FIG. 1, the common-mode noise filter 100 of the present embodiment comprises a first transmission structure 11 and a second transmission structure 12. The first transmission structure 11 and the second transmission structure 12 are combined into a pair of differential transmission structures for transmitting a differential signal.

The first transmission structure 11 comprises a first signal input end (In+) and a first signal output end (Out+). At least one first transmission unit 111 is connected between the first signal input end (In+) and the first signal output end (Out+) in series. The second transmission structure 12 comprises a second signal input end (In−) and a second signal output end (Out−). At least one second transmission unit 121 is connected between the second signal input end (In−) and the second signal output end (Out−) in series. In the present invention, the first transmission unit 111 and the second transmission unit 121 may be a strongly-coupled transmission line, a high-impedance transmission line, or an inductor, respectively.

Two first capacitors 131 are connected between the first signal input end (In+) and the second signal input end (In−) in series or connected between a left side end of the first transmission unit 111 and a left side end of the second transmission unit 121 in series. Besides, the two first capacitors 131 are connected at a first node 130 together. In a preferred embodiment of the present invention, the capacitance value of the first capacitor 131 located above the first node 130 is equal to the capacitance value of the first capacitor 131 located under the first node 130. The first transmission structure 11 is connected to the second transmission structure 12 via the two first capacitors 131, so that a low-pass filter is formed by the first transmission unit 111 and the first capacitor 131 located above the first node 130, and formed by the second transmission unit 121 and the first capacitor 131 located under the first node 130, respectively.

The common-mode noise filter 100 further comprises a first common-mode noise suppression circuit 15 connected between the first node 130 and a reference potential. In the present invention, the reference potential is a RF ground or a direct current potential. The first common-mode noise suppression circuit 15 comprises a first lossy element 151 and a second capacitor 152. The first lossy element 151 and the second capacitor 152 are connected together in series or parallel between the first node 130 and the reference potential. In the present invention, the first lossy element 151 is having a real part of impedance that is not equal to zero. The first lossy element 151 is an impedance element or an element capable of consuming electromagnetic wave energy.

The first common-mode noise suppression circuit 15 and the first capacitors 131 connected therewith are combined into a first resonance circuit. When the first resonance circuit resonates, the common-mode noise transmitted on the differential transmission structure consisted of the first transmission structure 11 and the second transmission structure 12 will be guided to the first common-mode noise suppression circuit 15, and then the common-mode noise will be absorbed by the first lossy element 151 of the first common-mode noise suppression circuit 15. Furthermore, the common-mode noise filter 100 can generate resonances at multiple frequency bands because a capacitive element (such as a second capacitor 152) is provided in the first common mode noise suppression circuit 15 so as to effectively suppress the common mode noise in a broader frequency band.

Figure 2:
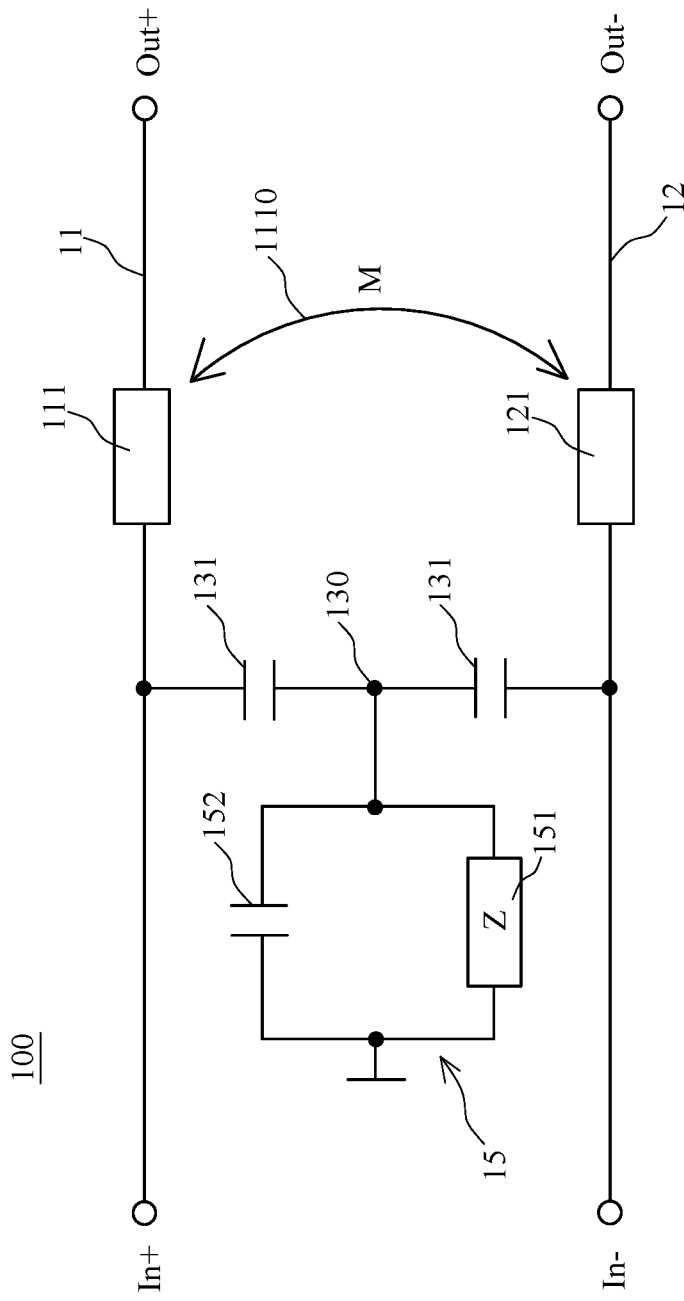
FIG. 2 is a circuit diagram of a common-mode noise filter according to another embodiment of the present invention.

In one embodiment of the present invention, as shown in FIG. 2, the first transmission unit 111 is a first inductor, the second transmission unit 121 is a second inductor, a mutual coupling 1110 is formed between the first transmission unit 111 of the first transmission structure 11 and the second transmission unit 121 of the second transmission structure 12. The mutual coupling 1110 can increase inductance values of the first transmission unit 111 and the second transmission unit 121 to improve the inductive reactance of the first transmission unit 111 and the second transmission unit 121 to the common-mode noise, and achieve the purpose of attenuating the common-mode noise.

Figure 3:
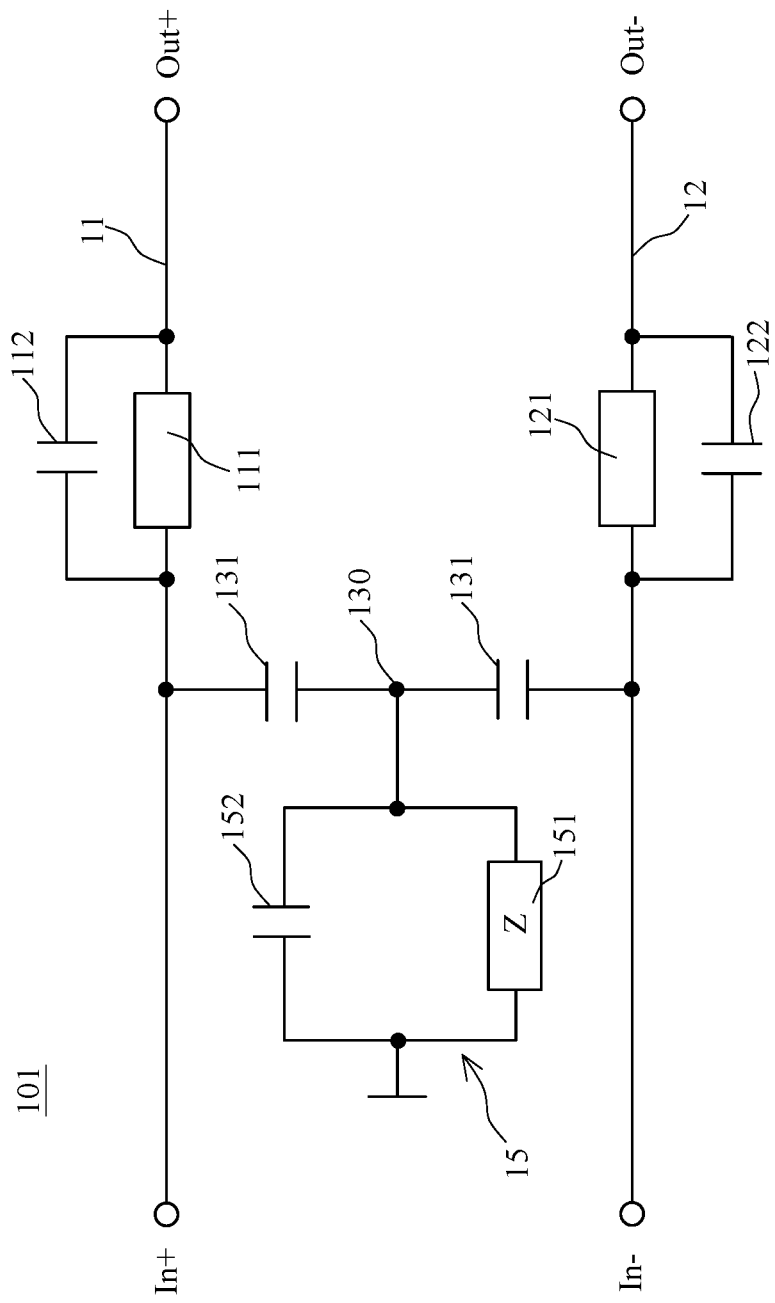
FIG. 3 is a circuit diagram of a common-mode noise filter according to another embodiment of the present invention.

Referring to FIG. 3, there shows a circuit diagram of a common-mode noise filter according to another embodiment of the present invention. Compared with the common-mode noise filter 100 of the above embodiment, in the common-mode noise filter 101 of FIG. 3, each first transmission unit 111 is connected with a corresponding third capacitor 112 in parallel, and each second transmission unit 121 is connected with a corresponding fourth capacitor 122 in parallel.

Figure 4:
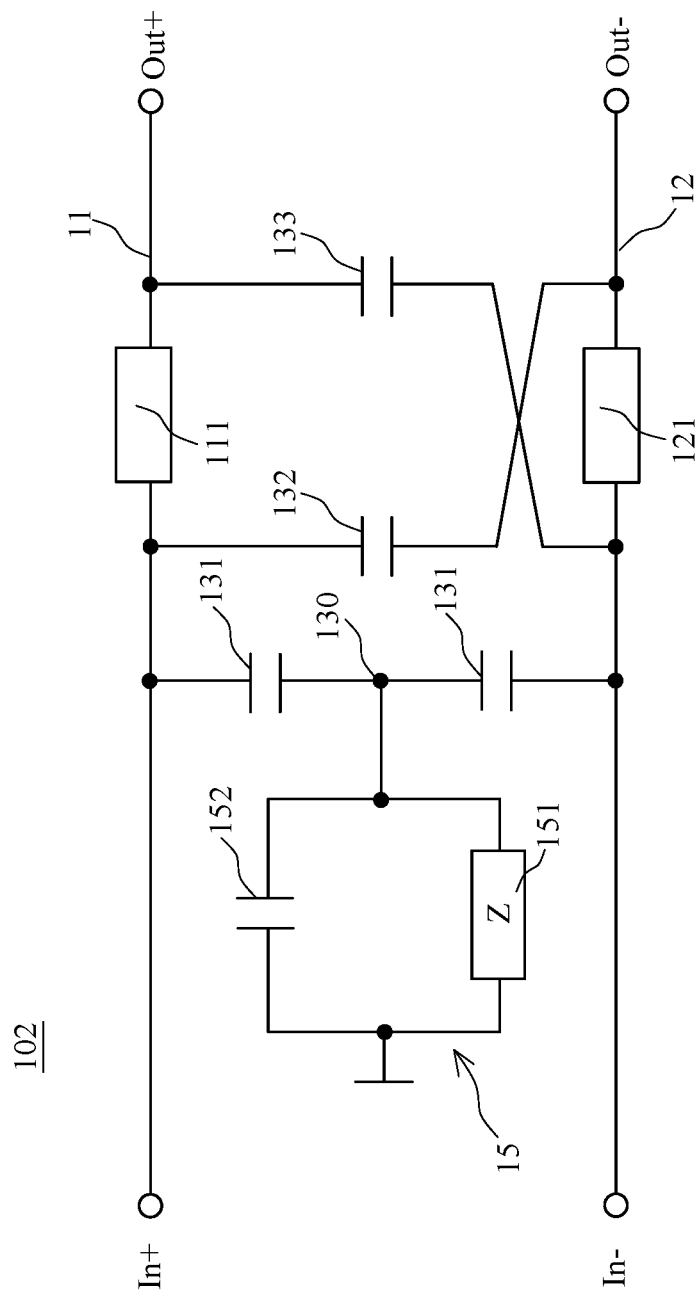
FIG. 4 is a circuit diagram of a common-mode noise filter according to another embodiment of the present invention.

Referring to FIG. 4, there is shown a circuit diagram of a common-mode noise filter according to another embodiment of the present invention. Compared with the common-mode noise filter 100 of the above embodiment, the common-mode noise filter 102 in FIG. 4 further comprises a fifth capacitor 132 and a sixth capacitor 133. A left side end and a right side end of the first transmission unit 111 are connected to one end of the fifth capacitor 132 and one end of the sixth capacitor 133, respectively, and a left side end and a right side end of the second transmission unit 121 are connected to other end of the sixth capacitor 133 and other end of the fifth capacitor 132, respectively. Thus, the fifth capacitor 132 and the sixth capacitor 133 are disposed between the first transmission structure 11 and the second transmission structure 12 in a crisscross form.

Figure 5:
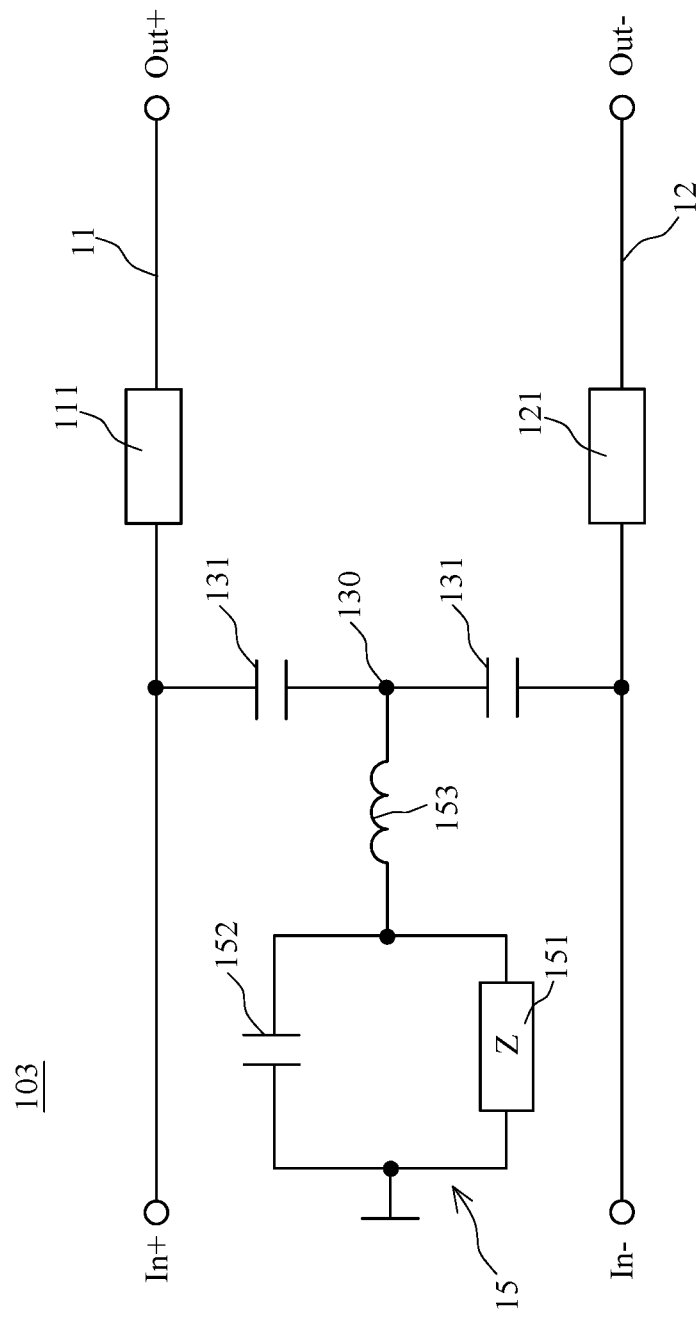
FIG. 5 is a circuit diagram of a common-mode noise filter according to another embodiment of the present invention.

Referring to FIG. 5, there is shown a circuit diagram of a common-mode noise filter according to another embodiment of the present invention. Compared with the common-mode noise filter 100 of the above embodiment, the common-mode noise filter 103 in FIG. 5 further comprises a third inductor 153. The third inductor 153 is provided at one end thereof connected to the first node 130, and other end thereof connected to the reference potential via the first lossy element 151 and the second capacitor 152 connected therewith in parallel.

Figure 6:
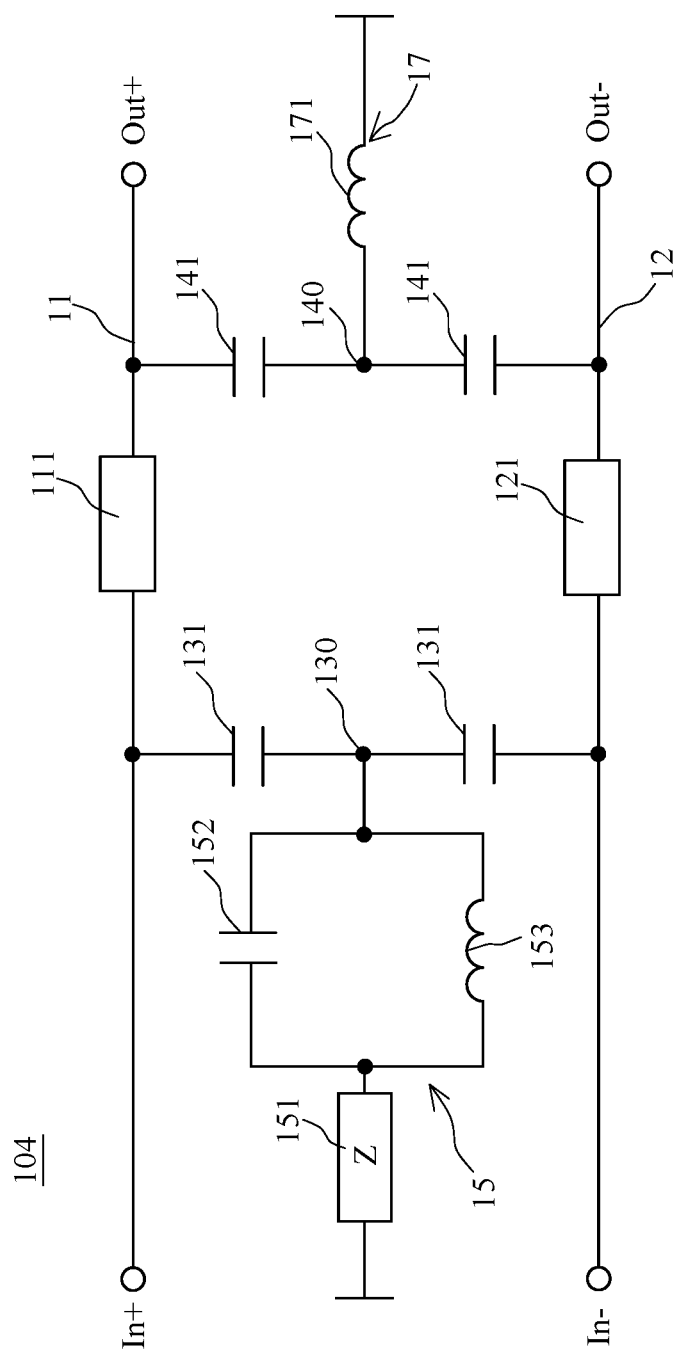
FIG. 6 is a circuit diagram of a common-mode noise filter according to another embodiment of the present invention.

Referring to FIG. 6, there is shown a circuit diagram of a common-mode noise filter according to another embodiment of the present invention. As shown in FIG. 6, the first common-mode noise suppression circuit 15 of the common-mode noise filter 104 of the present embodiment comprises a first lossy element 151, a second capacitor 152, and a third inductor 153. The second capacitor 152 is connected to the third inductor 153 in parallel. The first lossy element 15 is provided at one end thereof connected to the first node 130 via the second capacitor 152 and the third inductor 153 connected therewith in parallel, and other end thereof connected to the reference potential. Furthermore, the common-mode noise filter 104 of the present embodiment further comprises two seventh capacitors 141 and a second common-mode noise suppression circuit 17. Two seventh capacitors 141 are connected between the first signal output end (Out+) and the second signal output end in series (Out−) or connected between a right side end of the first transmission unit 111 and a right end of the second transmission unit 121 in series. Besides, the two seventh capacitors 141 are connected at a second node 140 together. In a preferred embodiment of the present invention, a capacitance value of the seventh capacitor 141 located above the second node 140 is equal to a capacitance value of the seventh capacitor 141 located under the second node 140.

The second common-mode noise suppression circuit 17 comprises a fourth inductor 171 connected between the second node 140 and the reference potential. The fourth inductor 171 and each of the seventh capacitors 141 are combined into a second resonance circuit, respectively. When the second resonance circuit resonates, the common-mode noise transmitted on the differential transmission structure consisted of the first transmission structure 11 and the second transmission structure 12 will be guided to the second common-mode noise suppression circuit 17, and then the common-mode noise will be reflected by the fourth inductor 171 of the second common-mode noise suppression circuit 17, such that the common-mode noise can be prohibited to transmit to the noise radiator, which is connected to a back end of the common-mode noise filter 104, via the first signal output end (Out+) and the second signal output end (Out−) of the differential transmission structure.

In one embodiment of the present invention, a plurality of the first transmission units 111 are connected in series between the first signal input end (In+) and the first signal output end (Out+) of the first transmission structure 11, and a plurality of the second transmission units 121 are connected in series between the second signal input end (In−) and the second signal output end (Out−) of the second transmission structure 12. Two sides of each of the first transmission units 111 and two sides of each of the second transmission units 121 can be connected to one corresponding first common-mode noise suppression circuit 15 and/or one corresponding second common-mode noise suppression circuit 17 via the capacitors 131 or 141. Accordingly, the common-mode noise filter 104 can suppress the common-mode noise by the multi-stage common-mode noise suppression circuits 15 and 17.

Figure 7:
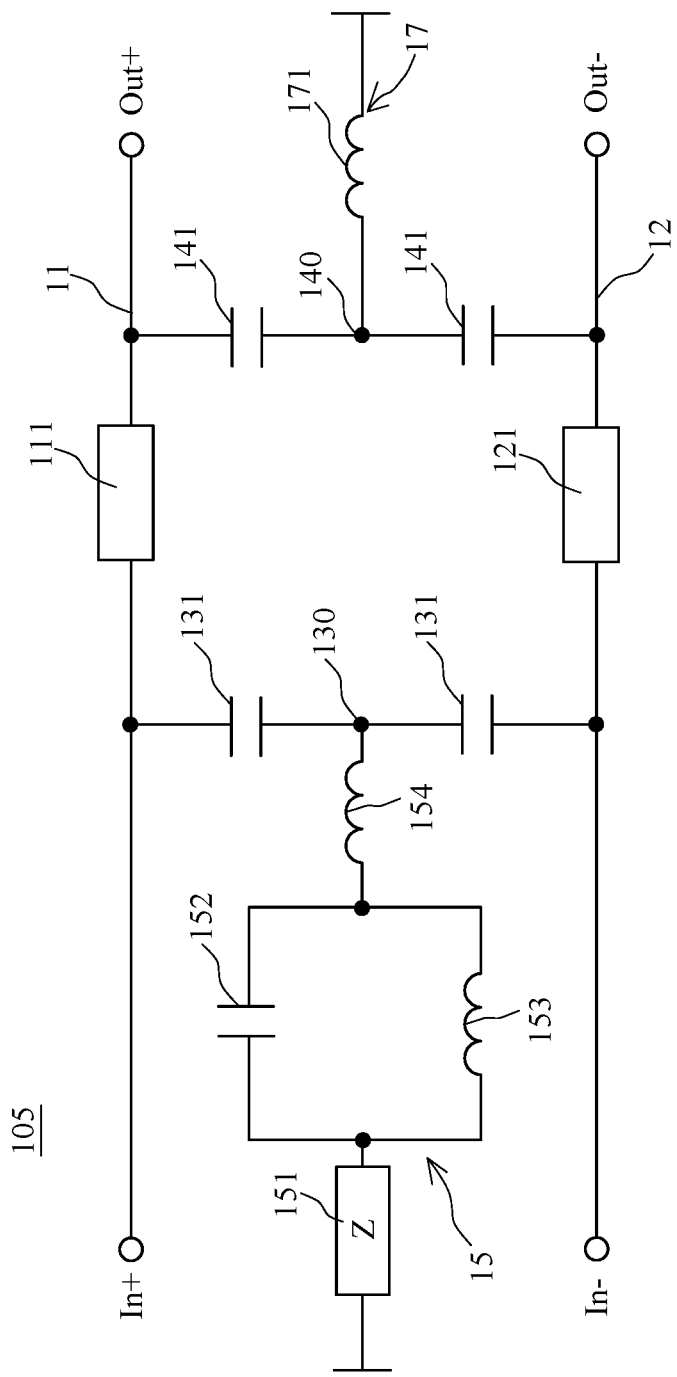
FIG. 7 is a circuit diagram of a common-mode noise filter according to another embodiment of the present invention.

Further, in the common-mode noise filter 105 of the embodiment of FIG. 7, the first common-mode noise suppression circuit 15 further comprises a fifth inductor 154. The fifth inductor 154 is provided at one end thereof connected to the first node 130, and other end thereof connected to the second capacitor 152 and the third inductor 153 connected therewith in parallel.

Figure 8:
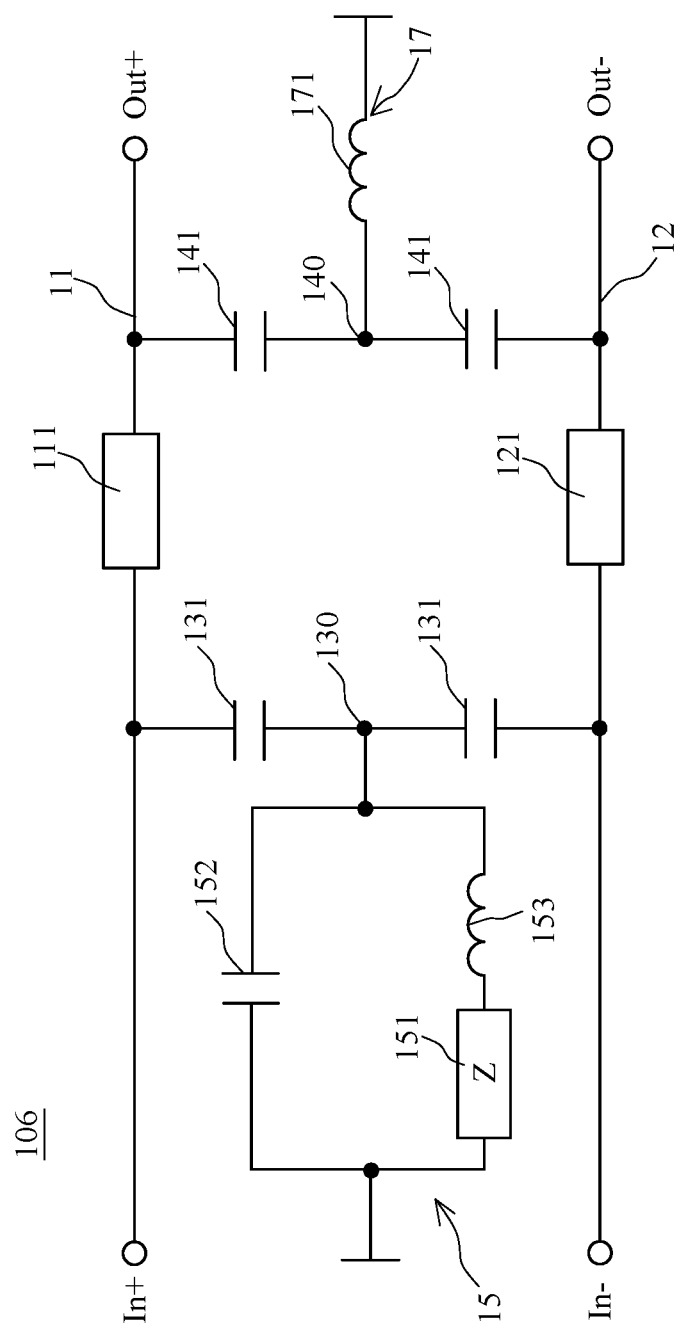
FIG. 8 is a circuit diagram of a common-mode noise filter according to another embodiment of the present invention.

Referring to FIG. 8, there shows a circuit diagram of a common-mode noise filter according to another embodiment of the present invention. As shown in FIG. 8, in the first common-mode noise suppression circuit 15 of the common-mode noise filter 106, the second capacitor 152 is connected between the first node 130 and the reference potential, and parallel with the first lossy element 151 and the third inductor 153 connected therewith in series.

Figure 9:
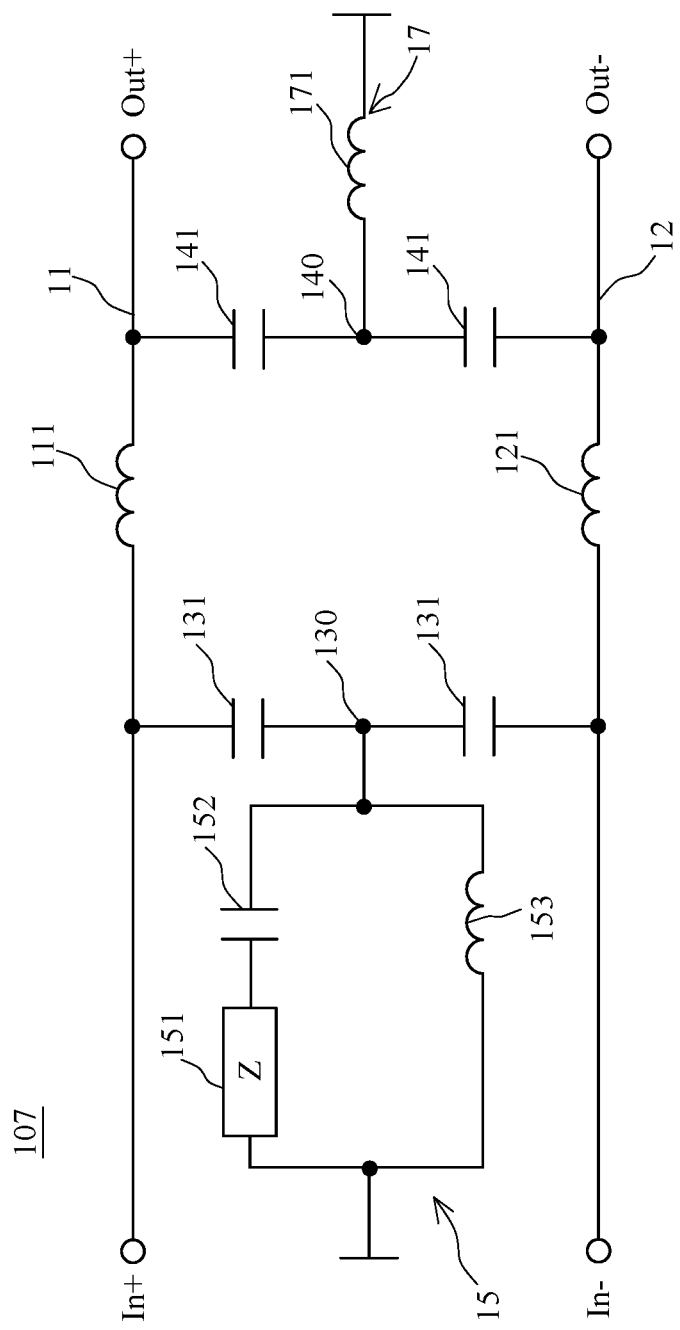
FIG. 9 is a circuit diagram of a common-mode noise filter according to another embodiment of the present invention.

Referring to FIG. 9, there shows a circuit diagram of a common-mode noise filter according to another embodiment of the present invention. As shown in FIG. 9, in the first common-mode noise suppression circuit 15 of the common-mode noise filter 107, the second capacitor 152 is connected to the first lossy element 151 in series, the third inductor 153 is provided between the first node 130 and the reference potential, and parallel with the first lossy element 151 and the second capacitor 152 connected therewith in series.

Figure 10:
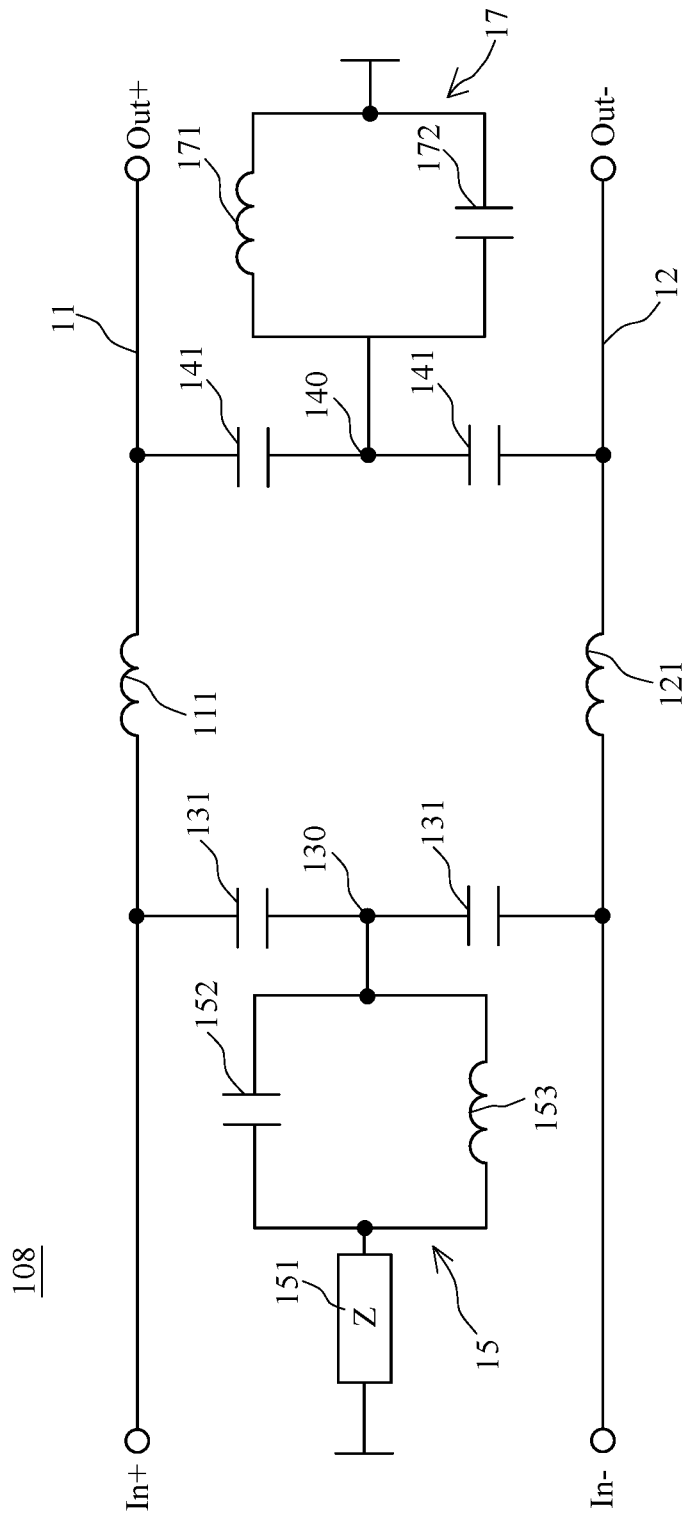
FIG. 10 is a circuit diagram of a common-mode noise filter according to another embodiment of the present invention.

Referring to FIG. 10, there shows a circuit diagram of a common-mode noise filter according to another embodiment of the present invention. Compared with the common-mode noise filter 104 in FIG. 6, the common-mode noise filter 108 of the present embodiment further comprises an eighth capacitor 172. The eighth capacitor 172 is connected to the fourth inductor 171 in series or in parallel. Thus, the common-mode noise filter 108 can resonate at multiple frequency bands by the eighth capacitor 172 provided in the second common-mode noise suppression circuit 17 so as to effectively suppress the common mode noise in a wider frequency band. In the design of actual circuit, the second common-mode noise suppression circuit 17 can be added with a lossy element, so that the second common-mode noise suppression circuit 17 can be used for absorbing the common-mode noise. Besides, the added lossy element can be connected to the fourth inductor 171 and the eighth capacitor 172 in series or parallel.

The first common-mode noise suppression circuit 15 is connected with the second common-mode noise suppression circuit 17 only through the first transmission unit 111 and the second transmission unit 121 of the transmission structures and the reference potential. For example, the first common-mode noise suppression circuit 15 and the second common-mode noise suppression circuit 17 are connected to the first transmission unit 111 and the second transmission unit 121 of the transmission structures 11, 12 via the corresponding first capacitor 131 and the corresponding seventh capacitor 141, respectively.

Figure 11:
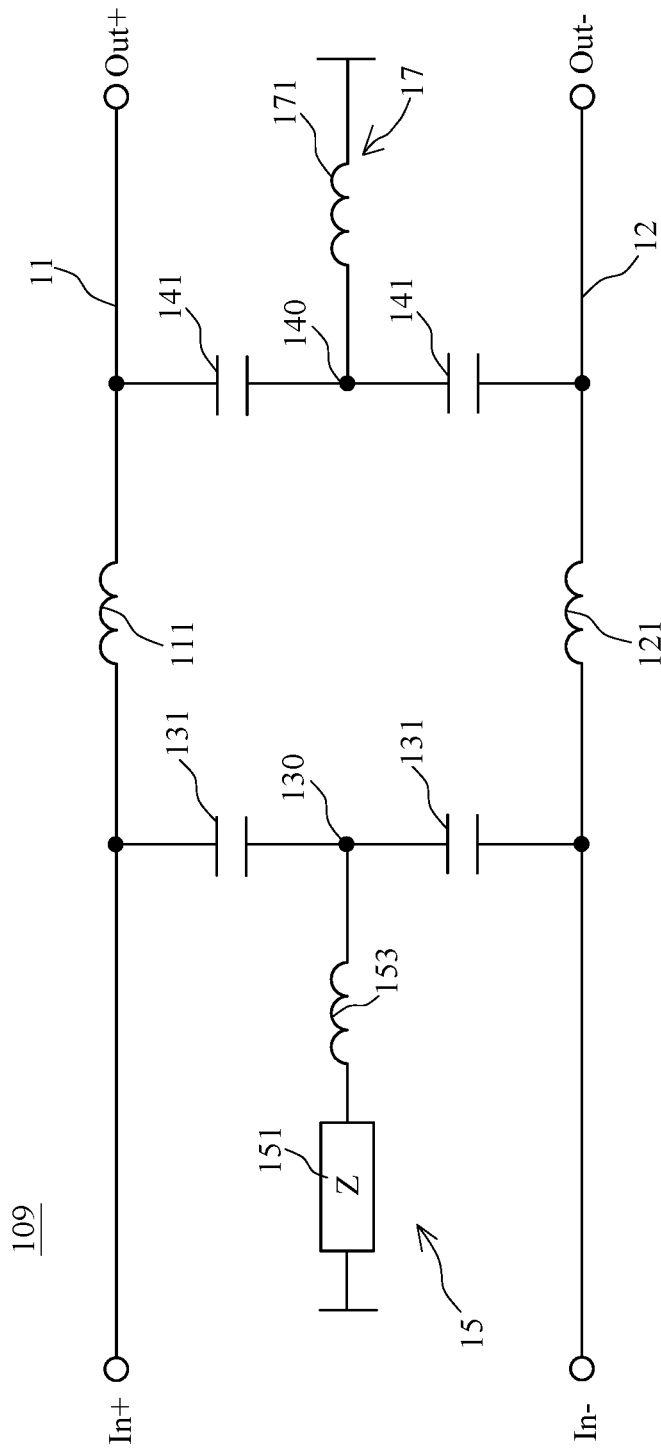
FIG. 11 is a circuit diagram of a common-mode noise filter according to another embodiment of the present invention.

Referring to FIG. 11, there shows a circuit diagram of a common-mode noise filter according to another embodiment of the present invention. As shown in FIG. 11, in the common-mode noise filter 109, the first common-mode noise suppression circuit 15 only includes the first lossy element 151 and the third inductor 153, but does not include the second capacitor 152. The first lossy element 151 and the third inductor 153 are connected in series between the first node 130 and the reference potential.

Figure 12:
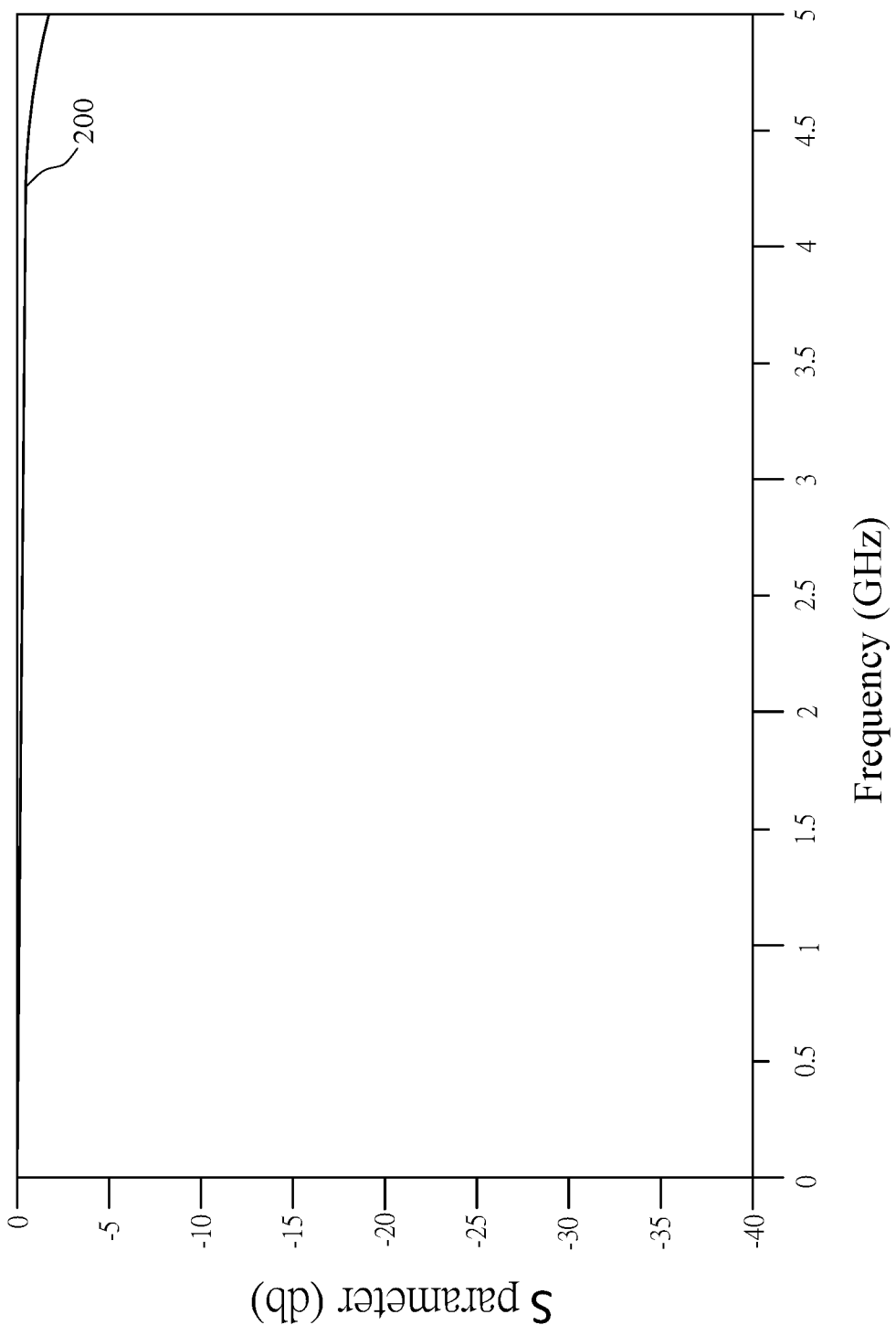
FIG. 12 is a response diagram of transmission coefficient of differential-mode signal of the common-mode noise filter of the present invention.
Figure 13:
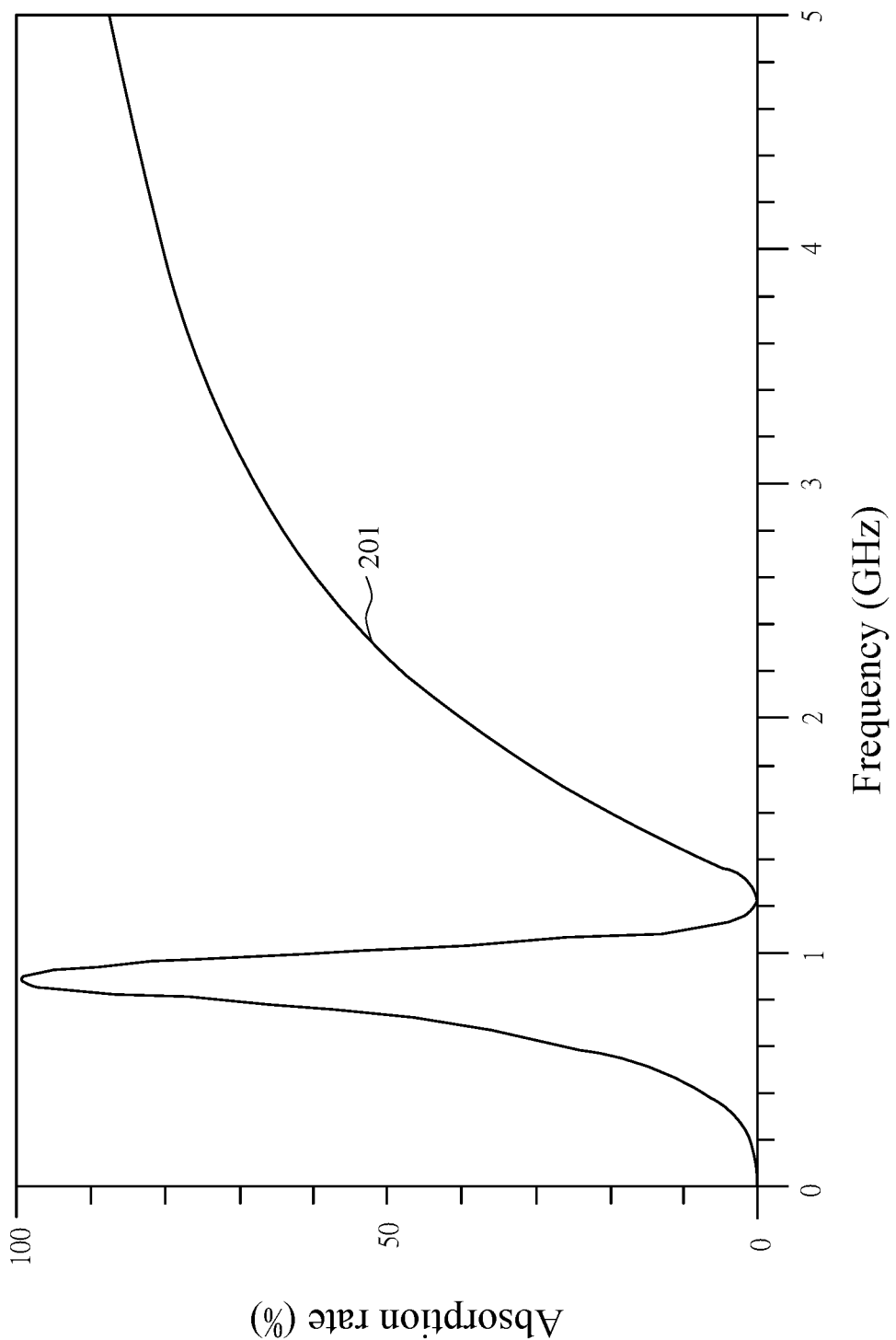
FIG. 13 is a response diagram of absorbing the common-mode noise by the common-mode noise filter in FIG. 6.
Figure 14:
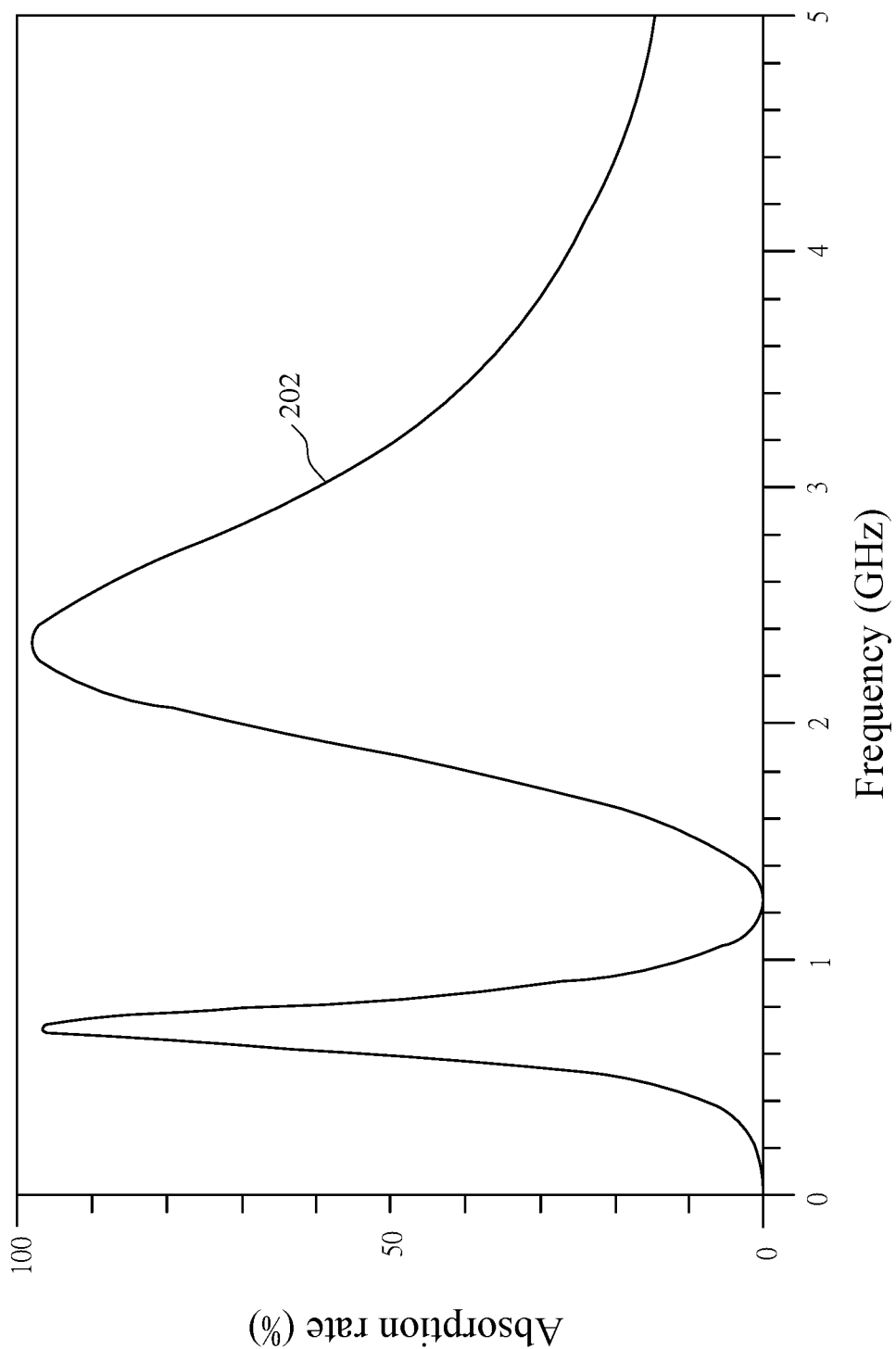
FIG. 14 is a response diagram of absorbing the common-mode noise by the common-mode noise filter in FIG. 7.
Figure 15:
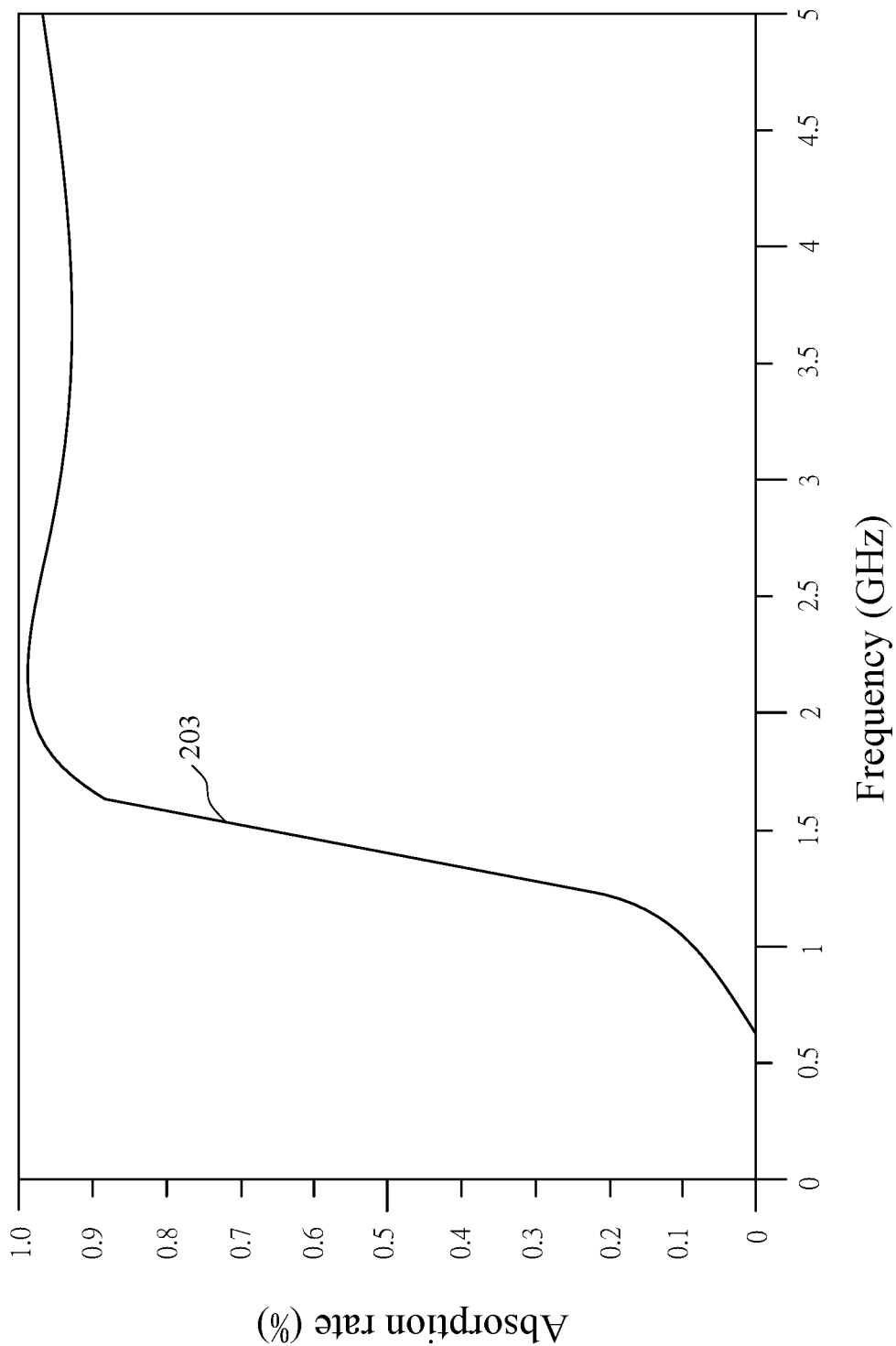
FIG. 15 is a response diagram of absorbing the common-mode noise by the common-mode noise filter in FIG. 9.
Figure 16:
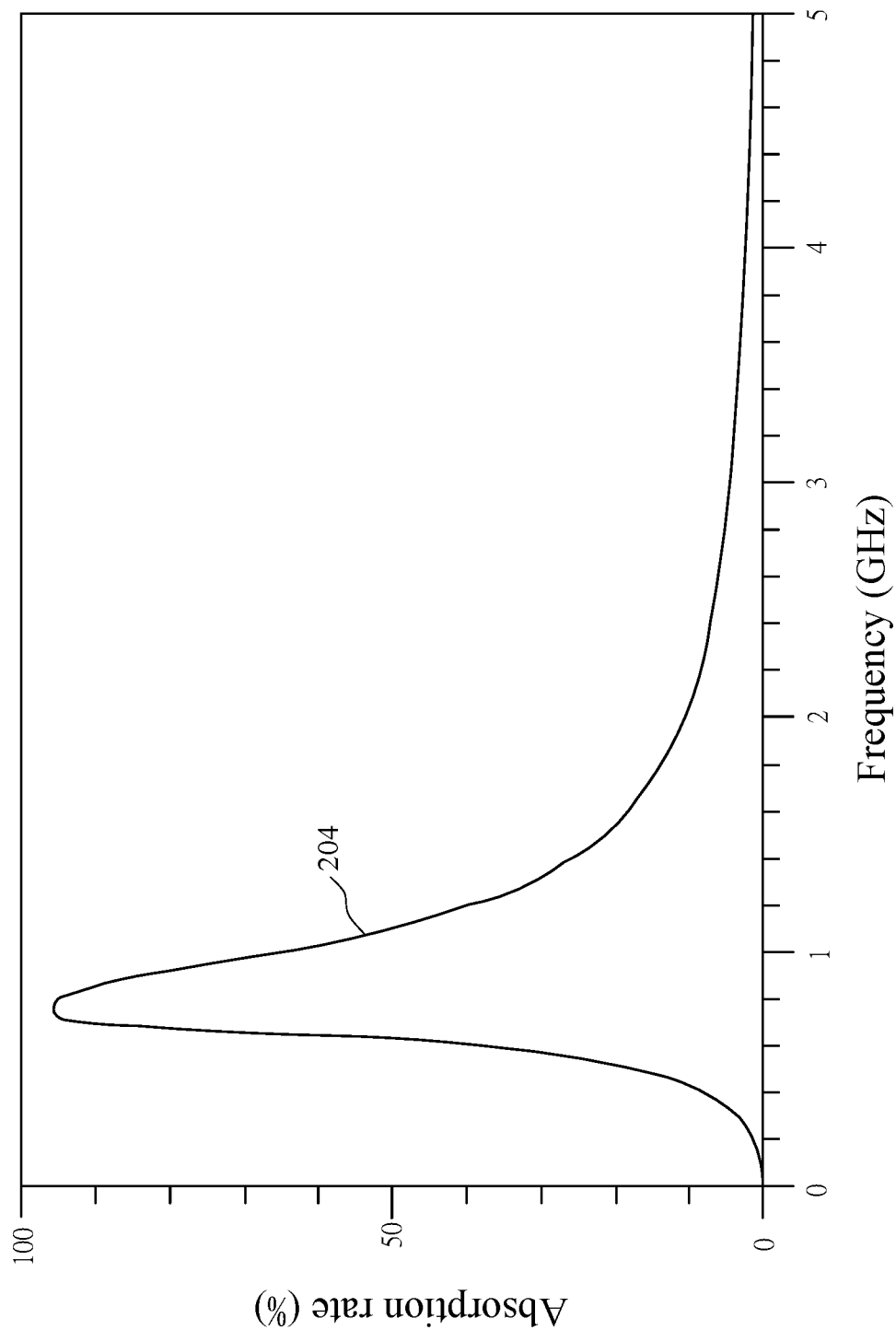
FIG. 16 is a response diagram of absorbing the common-mode noise by the common-mode noise filter in FIG. 11.

Referring to FIG. 12, there shows a response diagram of transmission coefficient of differential-mode signal of the common-mode noise filter of the present invention. As shown in FIG. 12, in the practical application of the common-mode noise filter 100, a differential-mode transmission coefficient $|S_{dd21}|$ curve 200 is close to 0 dB, which means that the differential signal may not be significantly decayed.

Referring to FIGS. 13, 14, 15, and 16, there are shown a response diagram of absorbing the common-mode noise by the common-mode noise filter in FIG. 6, a response diagram of absorbing the common-mode noise by the common-mode noise filter in FIG. 7, a response diagram of absorbing the common-mode noise by the common-mode noise filter in FIG. 9, and a response diagram of absorbing the common-mode noise by the common-mode noise filter in FIG. 11. Compared with the first common-mode noise suppression circuits 15 of the common-mode noise filter 104 in FIG. 6, the first common-mode noise suppression circuits 15 of the common-mode noise filter 105 in FIG. 7, and the common-mode noise filter 107 in FIG. 9, the first common-mode noise suppression circuit 15 of the common-mode noise filter 109 in FIG. 11 only includes the first lossy element 151 and the third inductor 153, and does not be provided with the second capacitor 152.

The curve 201 is a common-mode noise absorption rate curve of the common mode noise filter 104 in FIG. 6, the curve 202 is a common-mode noise absorption rate curve of the common mode noise filter 105 in FIG. 7, the curve 203 is a common-mode noise absorption rate curve of the common mode noise filter 107 in FIG. 9, and the curve 204 is a common-mode noise absorption rate curve of the common mode noise filter 109 in FIG. 11. Compared the curves 201, 202 and 203 with the curve 203, the common-mode noise filter 104 in FIG. 6 has an absorption rate of more than 50% for the common-mode noise at the frequency bands of 0.7 GHz-1.1 GHz and 2.4 GHz-5 GHz, the common-mode noise filter 105 in FIG. 7 has an absorption rate of more than 50% for the common-mode noise at the frequency bands of 0.6 GHz-0.9 GHz and 1.8 GHz-3.2 GHz, and the common-mode noise filter 107 in FIG. 9 has an absorption rate of more than 50% for the common-mode noise above the frequency band of 1.5 GHz. However, the common-mode noise filter 107 in FIG. 10 has an absorption rate of more than 50% for the common-mode noise at the frequency band of 0.6 GHz-1.2 GHz only. Accordingly, it can be seen that by adding a capacitive element into the first common-mode noise suppression circuit 15, the common-mode noise filters 104, 105, and 107 can resonate at multiple frequency bands, so as to effectively suppress the common-mode noise in the wider frequency band.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:

1. A common-mode noise filter, comprising:
   a first transmission structure comprising a first signal input end and a first signal output end, in which at least one first transmission unit is connected between the first signal input end and the first signal output end in series;
   a second transmission structure comprising a second signal input end and a second signal output end, in which at least one second transmission unit is connected between the second signal input end and the second signal output end in series, the first transmission structure and the second transmission structure are combined into a pair of differential transmission structures for transmitting a differential signal;
   two first capacitors connected between the first signal input end and the second signal input end in series or connected between one end of the at least one first transmission unit and one end of the at least one second transmission unit in series, wherein the two first capacitors are connected at a first node together; and
   a first common-mode noise suppression circuit, connected between the first node and a reference potential, and comprising a second capacitor, a first lossy element, and a third inductor, wherein the third inductor is provided between the first node and the reference potential, and parallel with the first lossy element and the second capacitor connected therewith in series; wherein the first common-mode noise suppression circuit absorbs a common-mode noise via the first lossy element.

2. The common-mode noise filter according to claim 1, wherein the at least one first transmission unit is a first inductor, the at least one second transmission unit is a second inductor, mutual coupling between the at least one first transmission unit and the at least one second transmission unit is formed.

3. The common-mode noise filter according to claim 1, wherein the at least one first transmission unit is connected to a third capacitor in parallel, and the at least one second transmission unit is connected to a fourth capacitor in parallel.

4. The common-mode noise filter according to claim 1, wherein the common-mode noise filter further comprises a fifth capacitor and a sixth capacitor, two ends of the at least one first transmission unit are connected to one end of the fifth capacitor and one end of the sixth capacitor, respectively, and two ends of the at least one second transmission unit are connected to other end of the sixth capacitor and other end of the fifth capacitor, respectively.

5. The common-mode noise filter according to claim 1, wherein the at least one first transmission unit or the at least one second transmission unit is a strongly-coupled transmission line, a high-impedance transmission line, or an inductor.

6. A common-mode noise filter, comprising:
   a first transmission structure comprising a first signal input end and a first signal output end, in which at least one first transmission unit is connected between the first signal input end and the first signal output end in series;
   a second transmission structure comprising a second signal input end and a second signal output end, in which at least one second transmission unit is connected between the second signal input end and the second signal output end in series, the first transmission structure and the second transmission structure are combined into a pair of differential transmission structures for transmitting a differential signal;
   two first capacitors connected between the first signal input end and the second signal input end in series or connected between one end of the at least one first transmission unit and one end of the at least one second transmission unit in series, wherein the two first capacitors are connected at a first node together; and
   a first common-mode noise suppression circuit, connected between the first node and a reference potential, and comprising a second capacitor, a first lossy element, a third inductor, and a fifth inductor;
   wherein the first common-mode noise suppression circuit absorbs a common-mode noise via the first lossy element;
   wherein the fifth inductor is provided at one end thereof connected to the first node, and other end thereof connected to the third inductor and the capacitor connected therewith in parallel;
   wherein the first lossy element is provided at one end thereof connected to the third inductor and the second capacitor connected therewith in parallel, and other end thereof connected to the reference potential.

7. The common-mode noise filter according to claim 6, wherein the at least one first transmission unit is a first inductor, the at least one second transmission unit is a second inductor, mutual coupling between the at least one first transmission unit and the at least one second transmission unit is formed.

8. The common-mode noise filter according to claim 6, wherein the at least one first transmission unit is connected to a third capacitor in parallel, and the at least one second transmission unit is connected to a fourth capacitor in parallel.

9. The common-mode noise filter according to claim 6, wherein the common-mode noise filter further comprises a fifth capacitor and a sixth capacitor, two ends of the at least one first transmission unit are connected to one end of the fifth capacitor and one end of the sixth capacitor, respectively, and two ends of the at least one second transmission unit are connected to other end of the sixth capacitor and other end of the fifth capacitor, respectively.

10. The common-mode noise filter according to claim 6, wherein the at least one first transmission unit or the at least one second transmission unit is a strongly-coupled transmission line, a high-impedance transmission line, or an inductor.

11. A common-mode noise filter, comprising:
a first transmission structure comprising a first signal input end and a first signal output end, in which at least one first transmission unit is connected between the first signal input end and the first signal output end in series;
a second transmission structure comprising a second signal input end and a second signal output end, in which at least one second transmission unit is connected between the second signal input end and the second signal output end in series, the first transmission structure and the second transmission structure are combined into a pair of differential transmission structures for transmitting a differential signal;
two first capacitors connected between the first signal input end and the second signal input end in series or connected between one end of the at least one first transmission unit and one end of the at least one second transmission unit in series, wherein the two first capacitors are connected at a first node together; and
a first common-mode noise suppression circuit, connected between the first node and a reference potential, and comprising a second capacitor and a first lossy element, wherein the second capacitor is connected to the first lossy element in series or parallel, and the first common-mode noise suppression circuit absorbs a common-mode noise via the first lossy element;
wherein the common-mode noise filter further comprises two seventh capacitors and a second common-mode noise suppression circuit; the two seventh capacitors are connected between the first signal output end and the second signal output end in series or connected between other end of the at least one first transmission unit and other end of the at least one second transmission unit in series; the two seventh capacitors are connected at a second node together; the second common-mode noise suppression circuit is connected between the second node and the reference potential, comprises a fourth inductor, and reflects the common-mode noise via the fourth inductor.

12. The common-mode noise filter according to claim 11, wherein the second common-mode noise suppression circuit further comprises an eighth capacitor connected to the fourth inductor in series or parallel.

13. The common-mode noise filter according to claim 12, wherein the second common-mode noise suppression circuit further comprises a second lossy element connected to the eighth capacitor and the fourth inductor in series or parallel.

14. A common-mode noise filter, comprising:
a first transmission structure comprising a first signal input end and a first signal output end, in which at least one first transmission unit is connected between the first signal input end and the first signal output end in series;
a second transmission structure comprising a second signal input end and a second signal output end, in which at least one second transmission unit is connected between the second signal input end and the second signal output end in series, the first transmission structure and the second transmission structure are combined into a pair of differential transmission structures for transmitting a differential signal;
two first capacitors connected between the first signal input end and the second signal input end in series or connected between one end of the at least one first transmission unit and one end of the at least one second transmission unit in series, wherein the two first capacitors are connected at a first node together;
a first common-mode noise suppression circuit, comprising a first lossy element and a third inductor, wherein the first lossy element and the third inductor are connected between the first node and a reference potential in series or parallel, the first common-mode noise suppression circuit absorbs a common-mode noise via the first lossy element;
two seventh capacitors connected between the first signal output end and the second signal output end in series or connected between other end of the at least one first transmission unit and other end of the at least one second transmission unit in series, wherein the two seventh capacitors are connected at a second node together; and
a second common-mode noise suppression circuit, connected between the second node and the reference potential, comprises a fourth inductor, and reflects the common-mode noise via the fourth inductor.

15. The common-mode noise filter according to claim 14, wherein the at least one first transmission unit is a first inductor, the at least one second transmission unit is a second inductor, mutual coupling between the at least one first transmission unit and the at least one second transmission unit is formed.

16. The common-mode noise filter according to claim 14, wherein the at least one first transmission unit is connected to a third capacitor in parallel, and the at least one second transmission unit is connected to a fourth capacitor in parallel.

17. The common-mode noise filter according to claim 14, wherein the common-mode noise filter further comprises a fifth capacitor and a sixth capacitor, two ends of the at least one first transmission unit are connected to one end of the fifth capacitor and one end of the sixth capacitor, respectively, and two ends of the at least one second transmission unit are connected to other end of the sixth capacitor and other end of the fifth capacitor, respectively.

18. The common-mode noise filter according to claim 14, wherein the at least one first transmission unit or the at least one second transmission unit is a strongly-coupled transmission line, a high-impedance transmission line, or an inductor.

* * * * *